United States Patent
Venkatasubramanian et al.

(10) Patent No.: US 8,532,247 B2
(45) Date of Patent: Sep. 10, 2013

(54) INTEGER AND HALF CLOCK STEP DIVISION DIGITAL VARIABLE CLOCK DIVIDER

(75) Inventors: Ramakrishnan Venkatasubramanian, Plano, TX (US); Anthony Lell, Katy, TX (US); Raguram Damodaran, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 84 days.

(21) Appl. No.: 13/247,265

(22) Filed: Sep. 28, 2011

(65) Prior Publication Data

US 2012/0314833 A1    Dec. 13, 2012

Related U.S. Application Data

(60) Provisional application No. 61/387,283, filed on Sep. 28, 2010.

(51) Int. Cl.
*H03K 21/00* (2006.01)

(52) U.S. Cl.
USPC .............................. 377/48; 327/115; 327/117

(58) Field of Classification Search
USPC .................. 327/113–115, 117, 118; 377/47, 377/48
See application file for complete search history.

(56) References Cited

U.S. PATENT DOCUMENTS

| | | | | |
|---|---|---|---|---|
| 5,371,772 A * | 12/1994 | Al-Khairi | ........................ | 377/47 |
| 5,442,670 A | 8/1995 | Shu | | |
| 5,729,179 A * | 3/1998 | Sumi | .............................. | 331/12 |
| 6,469,549 B2 | 10/2002 | Carson | | |
| 6,617,893 B1 | 9/2003 | Born | | |
| 6,795,519 B2 * | 9/2004 | Chakravarthy | ................. | 377/48 |
| 8,134,389 B2 * | 3/2012 | Huang | ........................... | 327/117 |
| 8,369,477 B2 * | 2/2013 | Shibayama | ..................... | 377/47 |

OTHER PUBLICATIONS

"TMS320C6678 Multicore Fixed and Floating-Point Digital Signal Processor", Data Manual, SPRS691, Texas Instruments Incorporated, Nov. 2010, pp. 1-259.

* cited by examiner

*Primary Examiner* — Patrick O'Neill
(74) *Attorney, Agent, or Firm* — Robert D. Marshall, Jr.; Wade James Brady, III; Frederick J. Telecky, Jr.

(57) ABSTRACT

A clock divider divides a high speed input clock signal by an odd, even or fractional divide ratio. The clock divider receives a divide factor value F representative of a divide ratio N, wherein the N may be an odd or an even integer. A fractional indicator indicates a fractional divide ratio when one and an integral divide ratio when zero. A count indicator is asserted every N/2 input clock cycles when N is even. The count indicator is asserted alternately N/2 input clock cycles and then 1+N/2 input clock cycles when N is odd. The clock divider synthesizes one period of an output clock signal in response to each assertion of the count indicator for a fractional divide ratio and synthesizes one period of the output clock signal in response to two assertions of the count indicator for an integral divide ratio.

13 Claims, 12 Drawing Sheets

INTEGER AND HALF CLOCK STEP DIVISION DIGITAL VARIABLE CLOCK DIVIDER

CLAIM OF PRIORITY UNDER 35 U.S.C. 119(e)

The present application claims priority to and incorporates by reference U.S. Provisional Application No. 61/387,283, filed Sep. 28, 2010, entitled "Cache Controller Architecture."

FIELD OF THE INVENTION

This invention generally relates to management of clock generation in a digital system, and in particular to providing a clock divider for operation at 1 GHz or higher that performs odd, even and fractional division.

BACKGROUND OF THE INVENTION

System on Chip (SoC) is a concept that strives to integrate more and more functionality into a given device. This integration can take the form of either hardware or solution software. Performance gains are traditionally achieved by increased clock rates and more advanced process nodes. Many SoC designs pair a digital signal processor (DSP) with a reduced instruction set computing (RISC) processor to target specific applications. A more recent approach to increasing performance has been to create multi-core devices.

Complex SoCs require a scalable and convenient method of connecting a variety of peripheral blocks such as processors, accelerators, shared memory and IO devices while addressing the power, performance and cost requirements of the end application. Due to the complexity and high performance requirements of these devices, the chip interconnect tends to be hierarchical and partitioned depending on the latency tolerance and bandwidth requirements of the endpoints. The connectivity among the endpoints tends to be more flexible to allow for future devices that may be derived from a current device. In this scenario, management of clock signals that are provided to the various modules and components of the complex SoC may require dynamic changes in frequency. In many cases, different clock frequencies are required for different modules and components.

Different clock frequency signals are typically generated using a divider to divide down a higher frequency to a specified operating clock frequency. High speed integer clock dividers that guarantee 50% duty cycle for the output clock have been well understood and used widely in system-on-chip implementations. For example, U.S. Pat. No. 5,442,670, "Circuit for Dividing Clock Frequency by N.5, Where N is an Integer," describes an implementation that only supports N.5 division and is not easily scalable to support integer division. Further, this implementation may not be appropriate for use in high speed designs (>600 MHz).

U.S. Pat. No. 6,469,549, "Apparatus and Method for Odd Integer Signal Division," describes an implementation for an integer divider guaranteeing 50% duty cycle when the division ratio is odd.

U.S. Pat. No. 6,617,893, "Digital Variable Clock Divider," describes an implementation that performs integral and non-integral clock division; however, it may not be practical for high speed implementation (>600 MHz). Also the implementation requires a significant amount of area overhead.

BRIEF DESCRIPTION OF THE DRAWINGS

Particular embodiments in accordance with the invention will now be described, by way of example only, and with reference to the accompanying drawings.

Figure 1:
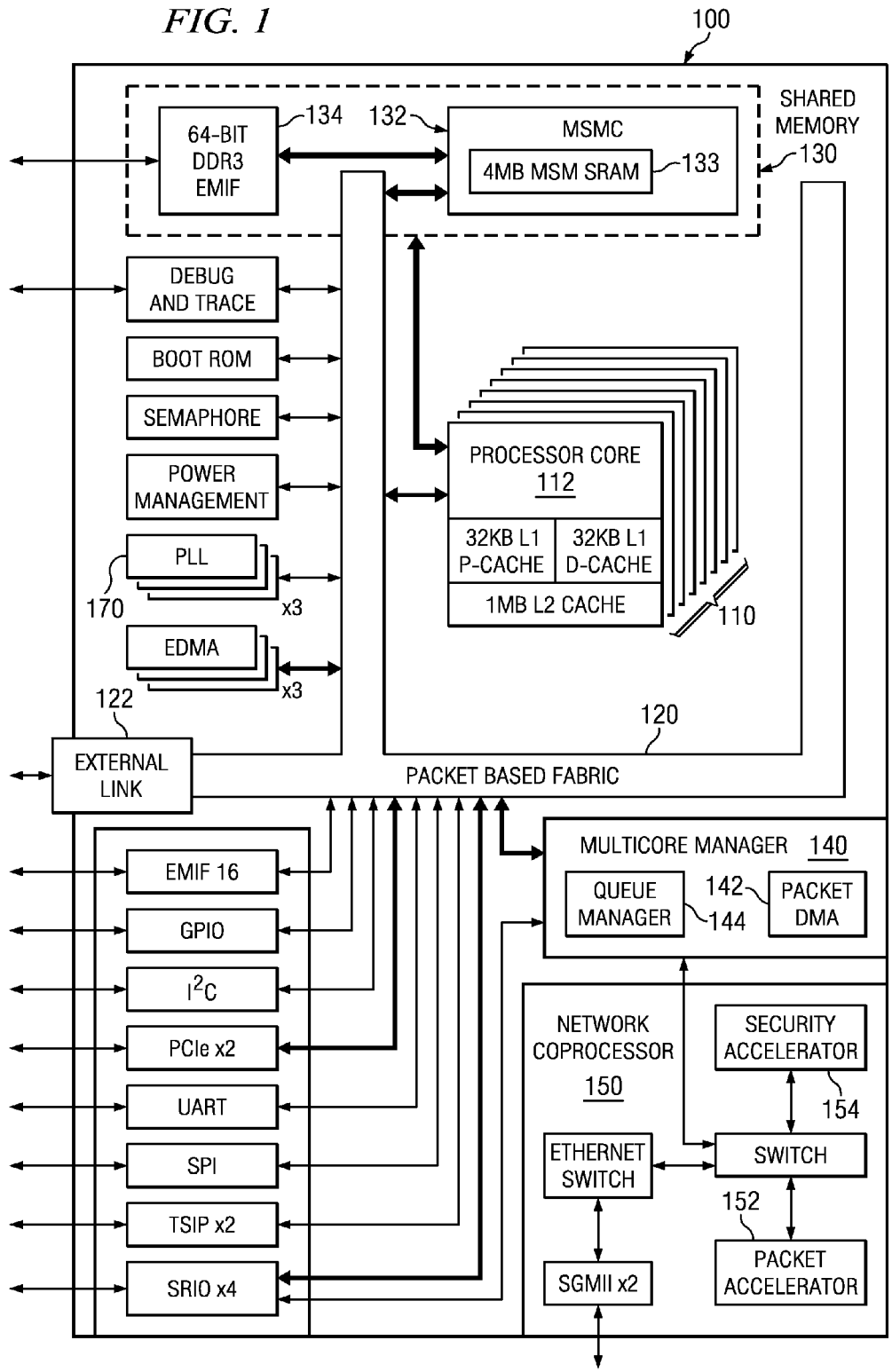
FIG. 1 is a functional block diagram of a system on chip (SoC) that includes an embodiment of the invention.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

High performance computing has taken on even greater importance with the advent of the Internet and cloud computing. To ensure the responsiveness of networks, online processing nodes and storage systems must have extremely robust processing capabilities and exceedingly fast data-throughput rates. Robotics, medical imaging systems, visual inspection systems, electronic test equipment, and high-performance wireless and communication systems, for example, must be able to process an extremely large volume of data with a high degree of precision. A multi-core architecture that embodies an aspect of the present invention will be described herein. In a typically embodiment, a multi-core system is implemented as a single system on chip (SoC). As used herein, the term "core" refers to a processing module that may contain an instruction processor, such as a digital signal processor (DSP) or other type of microprocessor, along with one or more levels of cache that are tightly coupled to the processor.

Half step clock division is a desired divide ratio in a high speed SoC. Typically the operating frequency of a peripheral is chosen to be an integer divide value of the highest frequency in the system. But a one half step division may also be desirable as it allows certain peripherals to operate at an optimal frequency, thereby maximizing the throughput of the system. For example, in a system that uses a 1.0 GHz system clock, there may be a peripheral that is designed to operate at a maximum clock frequency of only 400 MHz. Dividing the main clock by 2× yields 500 MHZ, which is too fast; while dividing the main clock signal by 3 yields 333.3 MHz, which would mean the peripheral would be operating at a lower performance level. However, dividing the main clock by 2.5 yields 400 MHz, which is the ideal clock frequency for this peripheral.

A half step division may also allow for better debugging capabilities and may therefore be useful in an SoC's design for testability (DFT) mode.

Alignment of the divided clocks is another important requirement in the system to ensure proper functioning of the SoC.

An embodiment of the invention provides a high-speed clock divider that is capable of integer and half step increment, and that guarantees alignment of the output clocks will be described in more detail below. Some embodiments of the invention also provide divided clocks that have a 50% duty cycle and have the ability to switch divide ratios on the fly. The clock divider described herein is architected for high speed and may be used in a core running at 1.0 GHz, or higher, for example. In one embodiment, the divider output clock has a duty cycle of 50% when the divide ratio is N and duty cycle of $[1/(N+\frac{1}{2})]$ when the divide ratio is N.5. Embodiments of the invention achieve half step division with very minimal increase in logic gate count over a divider that does only integer division.

In an embodiment that will be described in more detail below, multiple cores are interconnected via a packet based switch fabric that provides point to point interconnect between several devices on each cycle. Each core may receive requests from another core or from other external devices within the SoC to access various shared resources within the core, such as static random access memory (SRAM). A set of clock generation modules that are each capable of integer and half step increment, and that guarantee alignment of the output clocks at a particular edge with respect to the input clock is included in each core module of the SoC to provide various clock signals to the various logic blocks and components within each core module.

FIG. 1 is a functional block diagram of a system on chip (SoC) 100 that includes an embodiment of the invention. System 100 is a multi-core SoC that includes a set of processor modules 110 that each include a processor core, level one (L1) data and instruction caches, and a level two (L2) cache. In this embodiment, there are eight processor modules 110; however other embodiments may have fewer or greater number of processor modules. In this embodiment, each processor core is a digital signal processor (DSP); however, in other embodiments other types of processor cores may be used. A packet-based fabric 120 provides high-speed non-blocking channels that deliver as much as 2 terabits per second of on-chip throughput. Fabric 120 interconnects with memory subsystem 130 to provide an extensive two-layer memory structure in which data flows freely and effectively between processor modules 110, as will be described in more detail below. An example of SoC 100 is embodied in an SoC from Texas Instruments, and is described in more detail in "TMS320C6678—Multi-core Fixed and Floating-Point Signal Processor Data Manual", SPRS691, November 2010, which is incorporated by reference herein.

External link 122 provides direct chip-to-chip connectivity for local devices, and is also integral to the internal processing architecture of SoC 100. External link 122 is a fast and efficient interface with low protocol overhead and high throughput, running at an aggregate speed of 50 Gbps (four lanes at 12.5 Gbps each). Working in conjunction with a routing manager 140, link 122 transparently dispatches tasks to other local devices where they are executed as if they were being processed on local resources.

There are three levels of memory in the SoC 100. Each processor module 110 has its own level-1 program (L1P) and level-1 data (L1D) memory. Additionally, each module 110 has a local level-2 unified memory (L2). Each of the local memories can be independently configured as memory-mapped SRAM (static random access memory), cache or a combination of the two.

In addition, SoC 100 includes shared memory 130, comprising internal and external memory connected through the multi-core shared memory controller (MSMC) 132. MSMC 132 allows processor modules 110 to dynamically share the internal and external memories for both program and data. The MSMC internal RAM offers flexibility to programmers by allowing portions to be configured as shared level-2 RAM (SL2) or shared level-3 RAM (SL3). SL2 RAM is cacheable only within the local L1P and L1D caches, while SL3 is additionally cacheable in the local L2 caches.

External memory may be connected through the same memory controller 132 as the internal shared memory via external memory interface 134, rather than to chip system interconnect as has traditionally been done on embedded processor architectures, providing a fast path for software execution. In this embodiment, external memory may be treated as SL3 memory and therefore cacheable in L1 and L2.

SoC 100 may also include several co-processing accelerators that offload processing tasks from the processor cores in processor modules 110, thereby enabling sustained high application processing rates. SoC 100 may also contain an Ethernet media access controller (EMAC) network coprocessor block 150 that may include a packet accelerator 152 and a security accelerator 154 that work in tandem. The packet accelerator speeds the data flow throughout the core by transferring data to peripheral interfaces such as the Ethernet ports or Serial RapidIO (SRIO) without the involvement of any module 110's DSP processor. The security accelerator provides security processing for a number of popular encryption modes and algorithms, including: IPSec, SCTP, SRTP, 3GPP, SSL/TLS and several others.

Multi-core manager 140 provides single-core simplicity to multi-core device SoC 100. Multi-core manager 140 provides hardware-assisted functional acceleration that utilizes a packet-based hardware subsystem. With an extensive series of more than 8,000 queues managed by queue manager 144 and a packet-aware DMA controller 142, it optimizes the packet-based communications of the on-chip cores by practically eliminating all copy operations.

The low latencies and zero interrupts ensured by multi-core manager 140, as well as its transparent operations, enable new and more effective programming models such as task dispatchers. Moreover, software development cycles may be shortened significantly by several features included in multi-core manager 140, such as dynamic software partitioning. Multi-core manager 140 provides "fire and forget" software tasking that may allow repetitive tasks to be defined only once, and thereafter be accessed automatically without additional coding efforts.

Two types of buses exist in SoC 100 as part of packet based switch fabric 120: data buses and configuration buses. Some peripherals have both a data bus and a configuration bus interface, while others only have one type of interface. Furthermore, the bus interface width and speed varies from peripheral to peripheral. Configuration buses are mainly used to access the register space of a peripheral and the data buses are used mainly for data transfers. However, in some cases, the configuration bus is also used to transfer data. Similarly, the data bus can also be used to access the register space of a peripheral. For example, DDR3 memory controller 134 registers are accessed through their data bus interface.

Processor modules 110, the enhanced direct memory access (EDMA) traffic controllers, and the various system peripherals can be classified into two categories: masters and slaves. Masters are capable of initiating read and write transfers in the system and do not rely on the EDMA for their data transfers. Slaves on the other hand rely on the EDMA to perform transfers to and from them. Examples of masters include the EDMA traffic controllers, serial rapid I/O (SRIO), and Ethernet media access controller 150. Examples of slaves include the serial peripheral interface (SPI), universal asynchronous receiver/transmitter (UART), and inter-integrated circuit (I2C) interface.

Figure 2:
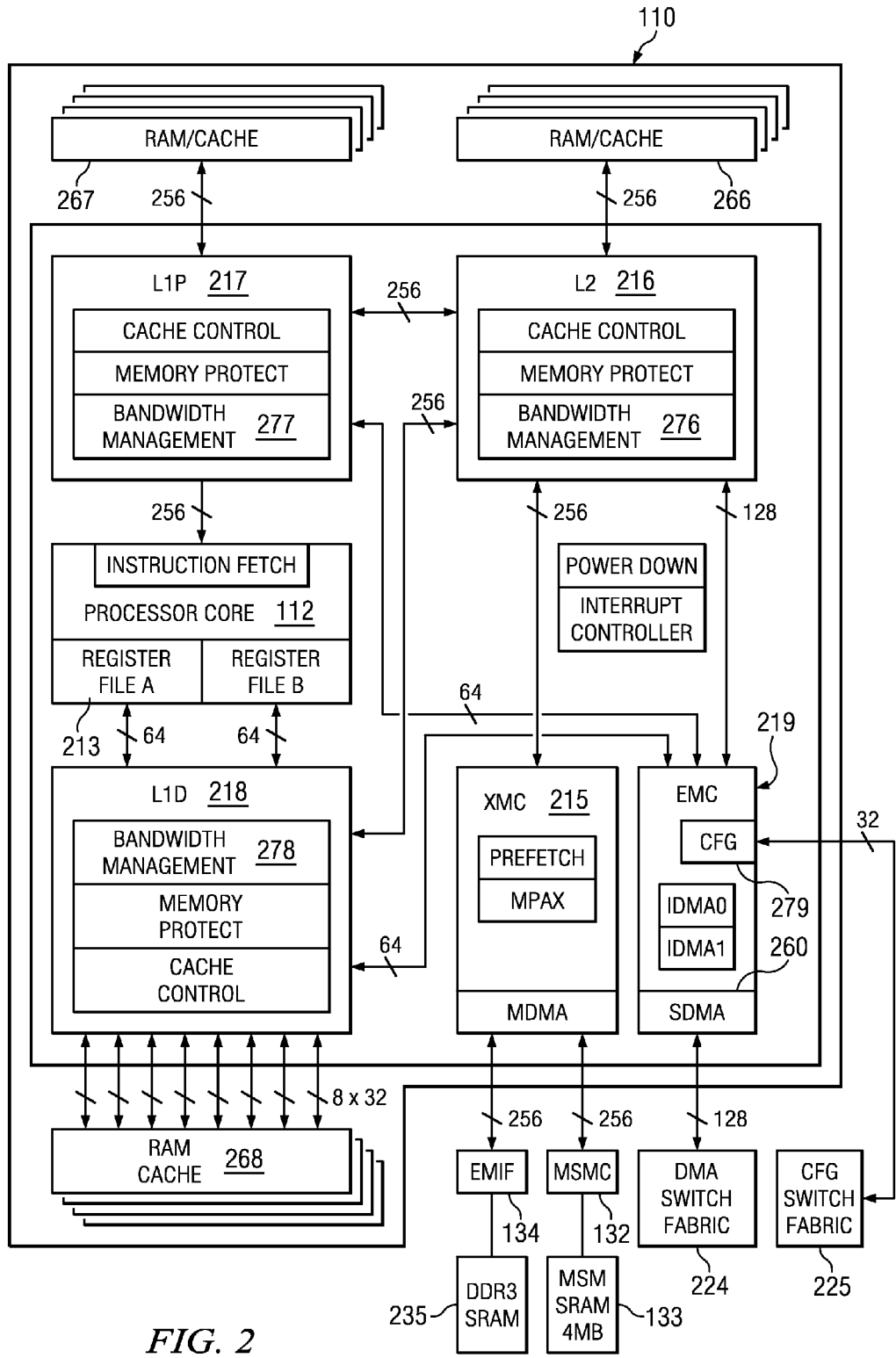
FIG. 2 is a more detailed block diagram of one processing module used in the SoC of FIG. 1.

FIG. 2 is a more detailed block diagram of one processing module 110 used in the SoC of FIG. 1. As mentioned above, SoC 100 contains two switch fabrics that form the packet based fabric 120 through which masters and slaves communicate. A data switch fabric 224, known as the data switched central resource (SCR), is a high-throughput interconnect mainly used to move data across the system. The data SCR is further divided into two smaller SCRs. One connects very high speed masters to slaves via 256-bit data buses running at a DSP/2 frequency. The other connects masters to slaves via 128-bit data buses running at a DSP/3 frequency. Peripherals that match the native bus width of the SCR it is coupled to can connect directly to the data SCR; other peripherals require a bridge.

A configuration switch fabric 225, also known as the configuration switch central resource (SCR), is mainly used to access peripheral registers. The configuration SCR connects the each processor module 110 and masters on the data switch fabric to slaves via 32-bit configuration buses running at a DSP/3 frequency. As with the data SCR, some peripherals require the use of a bridge to interface to the configuration SCR.

Bridges perform a variety of functions:
Conversion between configuration bus and data bus.
Width conversion between peripheral bus width and SCR bus width.
Frequency conversion between peripheral bus frequency and SCR bus frequency.

The priority level of all master peripheral traffic is defined at the boundary of switch fabric 120. User programmable priority registers are present to allow software configuration of the data traffic through the switch fabric. In this embodiment, a lower number means higher priority. For example: PRI=000b=urgent, PRI=111b=low.

All other masters provide their priority directly and do not need a default priority setting. Examples include the processor module 110, whose priorities are set through software in a unified memory controller (UMC) 216 control registers. All the Packet DMA based peripherals also have internal registers to define the priority level of their initiated transactions.

DSP processor core 112 includes eight functional units (not shown), two register files 213, and two data paths. The two general-purpose register files 213 (A and B) each contain 32 32-bit registers for a total of 64 registers. The general-purpose registers can be used for data or can be data address pointers. The data types supported include packed 8-bit data, packed 16-bit data, 32-bit data, 40-bit data, and 64-bit data. Multiplies also support 128-bit data. 40-bit-long or 64-bit-long values are stored in register pairs, with the 32 LSBs of data placed in an even register and the remaining 8 or 32 MSBs in the next upper register (which is always an odd-numbered register). 128-bit data values are stored in register quadruplets, with the 32 LSBs of data placed in a register that is a multiple of 4 and the remaining 96 MSBs in the next 3 upper registers.

The eight functional units (.M1, .L1, .D1, .S1, .M2, .L2, .D2, and .S2) (not shown) are each capable of executing one instruction every clock cycle. The .M functional units perform all multiply operations. The .S and .L units perform a general set of arithmetic, logical, and branch functions. The .D units primarily load data from memory to the register file and store results from the register file into memory. Each .M unit can perform one of the following fixed-point operations each clock cycle: four 32×32 bit multiplies, sixteen 16×16 bit multiplies, four 16×32 bit multiplies, four 8×8 bit multiplies, four 8×8 bit multiplies with add operations, and four 16×16 multiplies with add/subtract capabilities. There is also support for Galois field multiplication for 8-bit and 32-bit data. Many communications algorithms such as FFTs and modems require complex multiplication. Each .M unit can perform one 16×16 bit complex multiply with or without rounding capabilities, two 16×16 bit complex multiplies with rounding capability, and a 32×32 bit complex multiply with rounding capability. The .M unit can also perform two 16×16 bit and one 32×32 bit complex multiply instructions that multiply a complex number with a complex conjugate of another number with rounding capability.

Communication signal processing also requires an extensive use of matrix operations. Each .M unit is capable of multiplying a [1×2] complex vector by a [2×2] complex matrix per cycle with or without rounding capability. Another embodiment may allow multiplication of the conjugate of a [1×2] vector with a [2×2] complex matrix. Each .M unit may also include IEEE floating-point multiplication operations, which includes one single-precision multiply each cycle and one double-precision multiply every 4 cycles. There is also a mixed-precision multiply that allows multiplication of a single-precision value by a double-precision value and an operation allowing multiplication of two single-precision numbers resulting in a double-precision number. Each .M unit can also perform one the following floating-point operations each clock cycle: one, two, or four single-precision multiplies or a complex single-precision multiply.

The .L and .S units support up to 64-bit operands. This allows for arithmetic, logical, and data packing instructions to allow parallel operations per cycle.

An MFENCE instruction is provided that will create a processor stall until the completion of all the processor-triggered memory transactions, including:
Cache line fills
Writes from L1 D to L2 or from the processor module to MSMC and/or other system endpoints
Victim write backs
Block or global coherence operation
Cache mode changes
Outstanding XMC prefetch requests.

The MFENCE instruction is useful as a simple mechanism for programs to wait for these requests to reach their endpoint. It also provides ordering guarantees for writes arriving at a single endpoint via multiple paths, multiprocessor algorithms that depend on ordering, and manual coherence operations.

Figure 3:
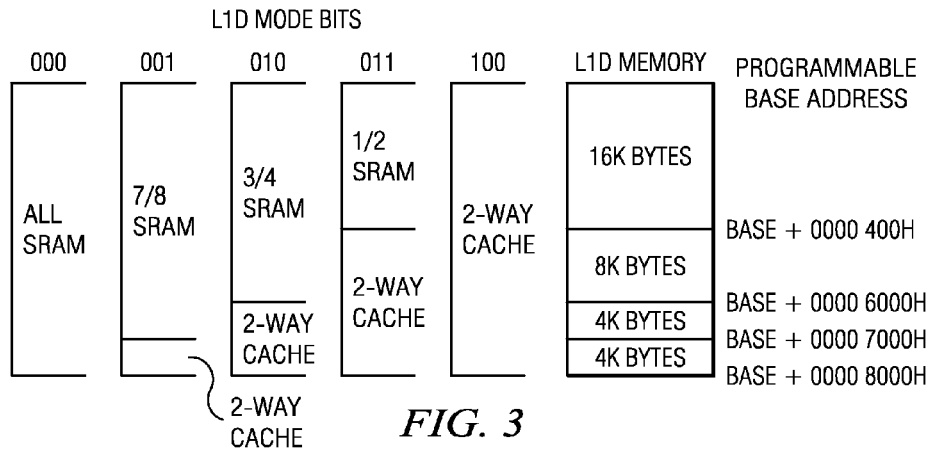
FIGS. 3 and 4 illustrate configuration of the L1 and L2 caches.

Each processor module 110 in this embodiment contains a 1024 KB level-2 cache/memory (L2) 216, a 32 KB level-1 program cache/memory (L1P) 217, and a 32 KB level-1 data cache/memory (L1D) 218. The device also contains a 4096 KB multi-core shared memory (MSM) 132. All memory in SoC 100 has a unique location in the memory map The L1P and L1D cache can be reconfigured via software through the L1 PMODE field of the L1P Configuration Register (L1PCFG) and the L1DMODE field of the L1D Configuration Register (L1DCFG) of each processor module 110 to be all SRAM, all cache memory, or various combinations as illustrated in FIG. 3, which illustrates an L1D configuration; L1P configuration is similar. L1D is a two-way set-associative cache, while L1P is a direct-mapped cache.

Figure 4:
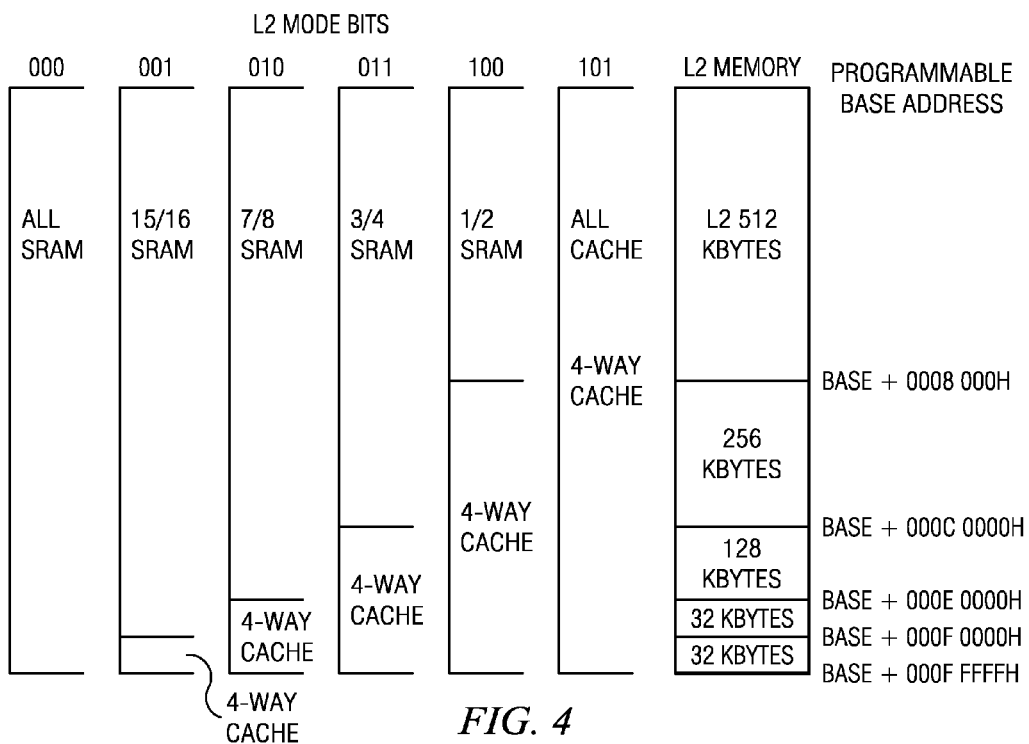

L2 memory can be configured as all SRAM, all 4-way set-associative cache, or a mix of the two, as illustrated in FIG. 4. The amount of L2 memory that is configured as cache is controlled through the L2MODE field of the L2 Configuration Register (L2CFG) of each processor module 110.

Global addresses are accessible to all masters in the system. In addition, local memory can be accessed directly by the associated processor through aliased addresses, where the eight MSBs are masked to zero. The aliasing is handled within each processor module 110 and allows for common code to be run unmodified on multiple cores. For example, address location 0x10800000 is the global base address for processor module 0's L2 memory. DSP Core 0 can access this location by either using 0x10800000 or 0x00800000. Any other master in SoC 100 must use 0x10800000 only. Conversely, 0x00800000 can by used by any of the cores as their own L2 base addresses.

Level 1 program (L1P) memory controller (PMC) 217 controls program cache memory 267 and includes memory protection and bandwidth management. Level 1 data (L1D) memory controller (DMC) 218 controls data cache memory 268 and includes memory protection and bandwidth management. Level 2 (L2) memory controller, unified memory controller (UMC) 216 controls L2 cache memory 266 and includes memory protection and bandwidth management. External memory controller (EMC) 219 includes Internal DMA (IDMA) and a slave DMA (SDMA) interface that is coupled to data switch fabric 224. The EMC is coupled to configuration switch fabric 225. Extended memory controller (XMC) 215 includes a master DMA (MDMA) interface that is coupled to MSMC 132 and to dual data rate 3 (DDR3) external memory controller 134. MSMC 132 is coupled to on-chip shared memory 133. External memory controller 134 may be coupled to off-chip DDR3 memory 235 that is external to SoC 100. A master DMA controller (MDMA) within XMC 215 may be used to initiate transaction requests to on-chip shared memory 133 and to off-chip shared memory 235.

Referring again to FIG. 2, when multiple requestors contend for a single resource within processor module 110, the conflict is resolved by granting access to the highest priority requestor. The following four resources are managed by the bandwidth management control hardware 276-279:
  Level 1 Program (L1P) SRAM/Cache 217
  Level 1 Data (L1D) SRAM/Cache 218
  Level 2 (L2) SRAM/Cache 216
  EMC 219

The priority level for operations initiated within the processor module 110 are declared through registers within each processor module 110. These operations are:
  DSP-initiated transfers
  User-programmed cache coherency operations
  IDMA-initiated transfers The priority level for operations initiated outside the processor modules 110 by system peripherals is declared through the Priority Allocation Register (PRI_ALLOC). System peripherals that are not associated with a field in PRI_ALLOC may have their own registers to program their priorities.

Integer and Half Step Clock Division

Figure 5A:
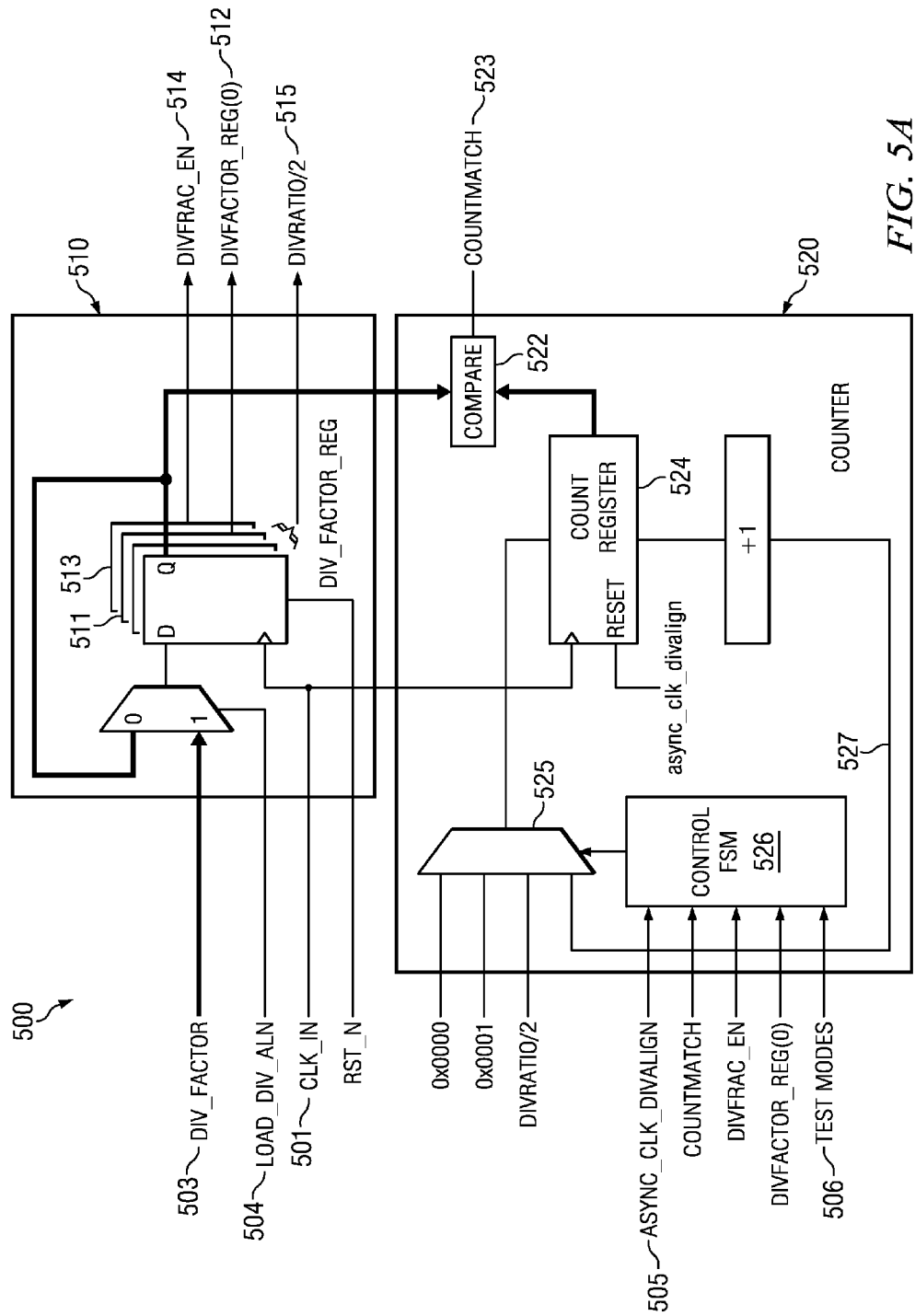
FIG. 5 includes FIGS. 5A and 5B that together are a block diagram for a clock divider configured to provide integer and half integer clock division.
Figure 5B:
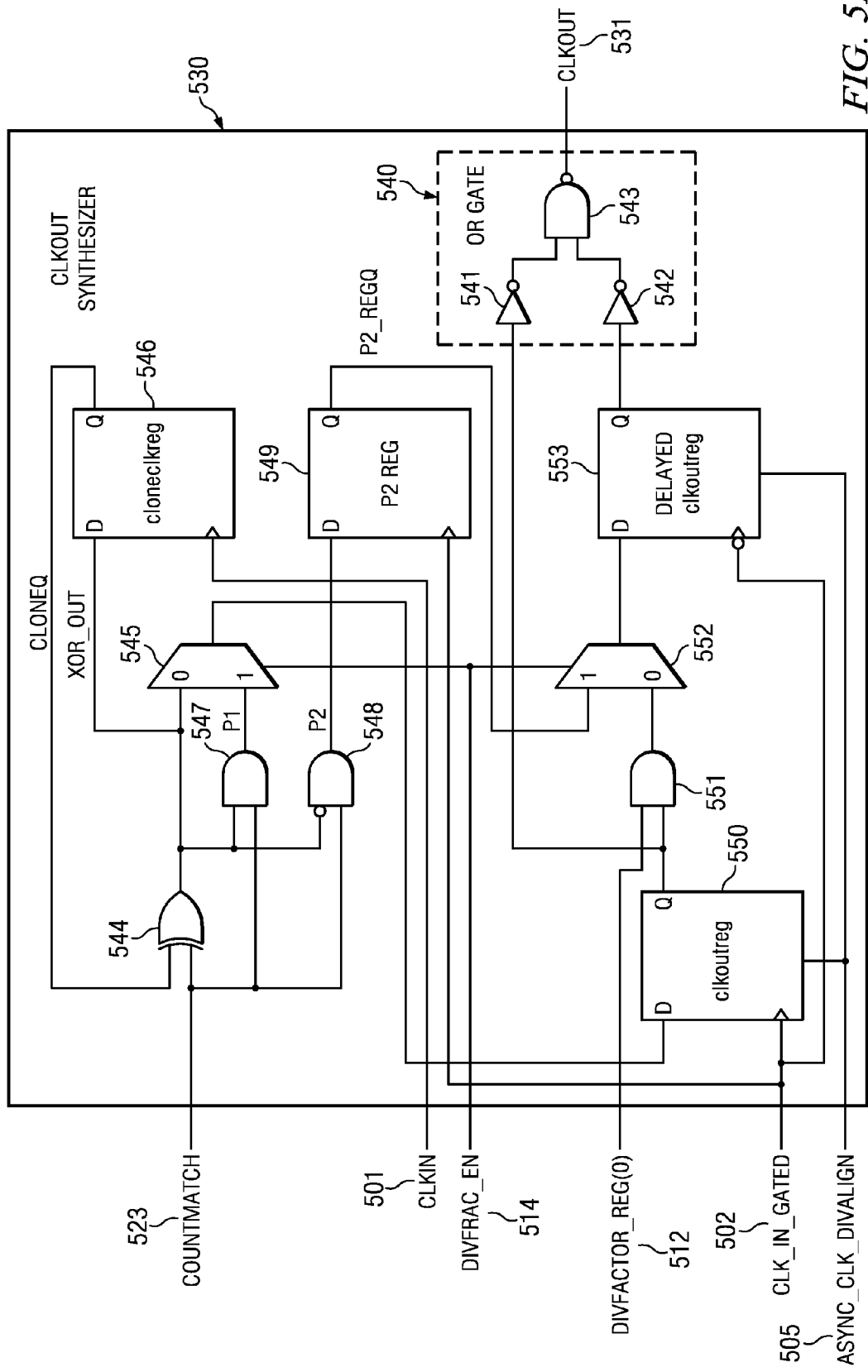

FIG. 5 includes FIGS. 5A and 5B that together are a block diagram for a clock divider 500 configured to provide integer and half integer clock division. A divide factor register 510 is configured to store a divide factor value 503 representative of a divide ratio N. A fractional indicator register 513 is included with the divide factor register that is configured to store a fractional indicator value 514. The fractional indicator indicates whether the divide ratio is an integer or a fractional value.

In an embodiment included within each core module 110, a fractional indicator value of logical "0" indicates the divide ratio is N, and when the fractional indicator value is logical "1" the divide ratio is N.5. The divide factor value 503 may have a different range in different embodiments. In core module 110, divide factor 503 may be sixteen bits, for example. A least significant bit 511 of divide factor register 510 provides signal 512 that indicates if the divide factor value is even or odd. Table 1 provides several examples of divide ratios and resulting divide factor and fractional indicator values. In this embodiment, divide factor register 510 is clocked by input clock 501, but is loaded from a shadow register only when load alignment signal 504 is asserted, as will be described in more detail with regard to FIG. 10. In another embodiment, divide factor register 510 may be a memory mapped register that is accessible by CPU 112 within core module 110, for example.

TABLE 1

| divide ratio examples | | | |
|---|---|---|---|
| Desired divide ratio | divfactor | Bit(0) | divfactor_frac |
| 1.0 | 0 | 1 | 0 |
| 1.5 | 0 | 1 | 1 |
| 2.0 | 1 | 0 | 0 |
| 2.5 | 1 | 1 | 1 |
| 3.0 | 1 | 1 | 0 |
| 3.5 | 1 | 1 | 1 |
| 4.0 | 2 | 0 | 0 |
| 4.5 | 2 | 1 | 1 |

Counter 520 is coupled to divide factor register 510. The counter is operable to receive an input clock signal 501 having a clock cycle frequency and to repeatedly count F/2 input clock cycles and assert a count indicator when N is even, and to alternately count F/2 input clock cycles and assert the count indicator and then count 1+F/2 input clock cycles and assert the count indicator when N is odd. Count register 524 is clocked by input clock 501 and loads the output of selector 525 under control of finite state machine 526. Selector 525 may select the count register plus one signal 527 to produce an incremental count. Selector 525 may initialize the count register with the divide factor divided by two signal 515 that is simply all of the divide factor bits from divide factor register except for the least significant bit. Selector 525 may also initialize count register 524 with a value of zero or a value of one.

Compare function 522 compares the value of count register 524 and divide factor register 510 and asserts count match signal 523 when a match occurs.

Figure 6:
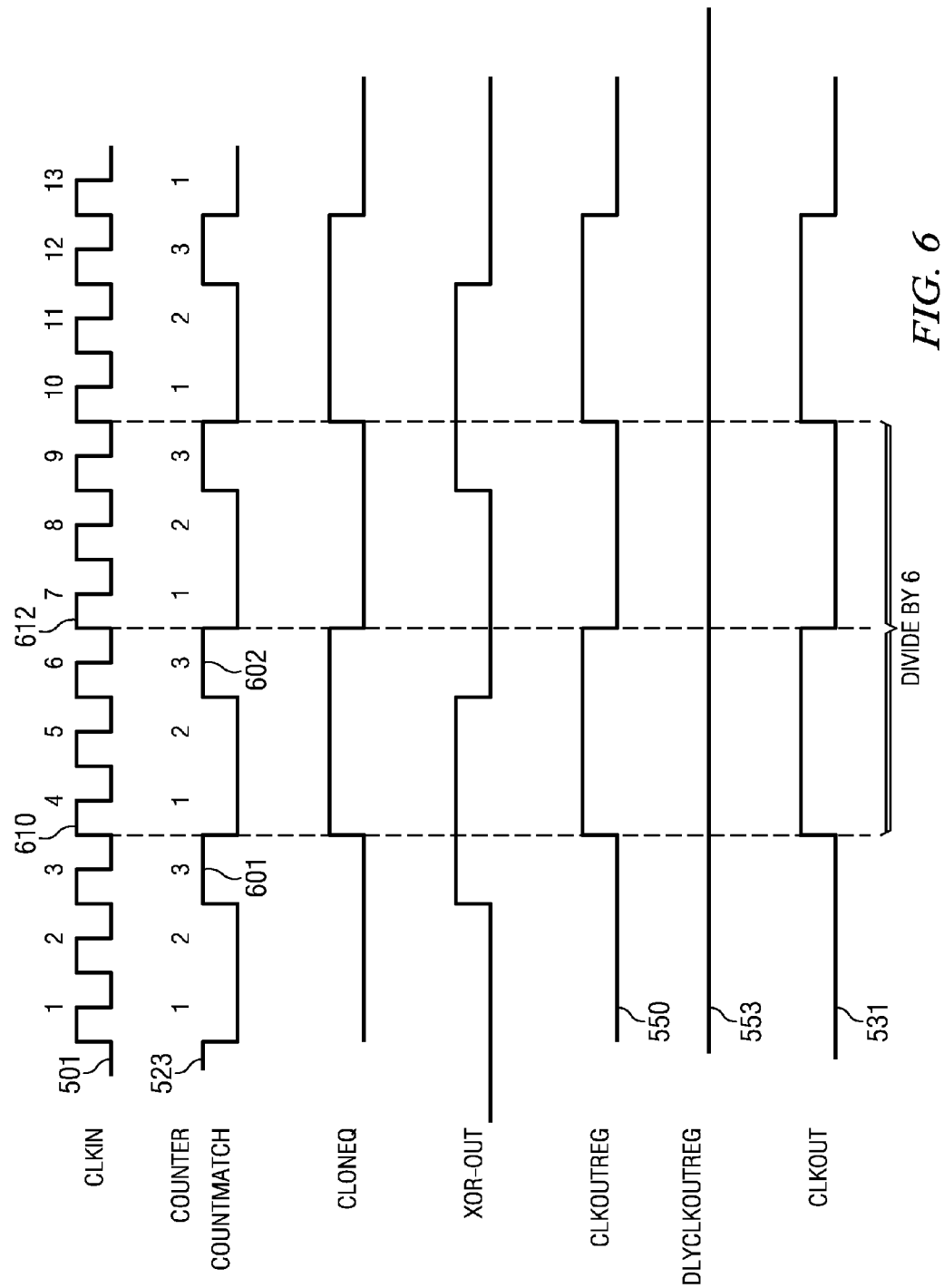
FIGS. 6-8 illustrate clock division by 6, 7 and 6.5 by the clock divider of FIG. 5.
Figure 7:
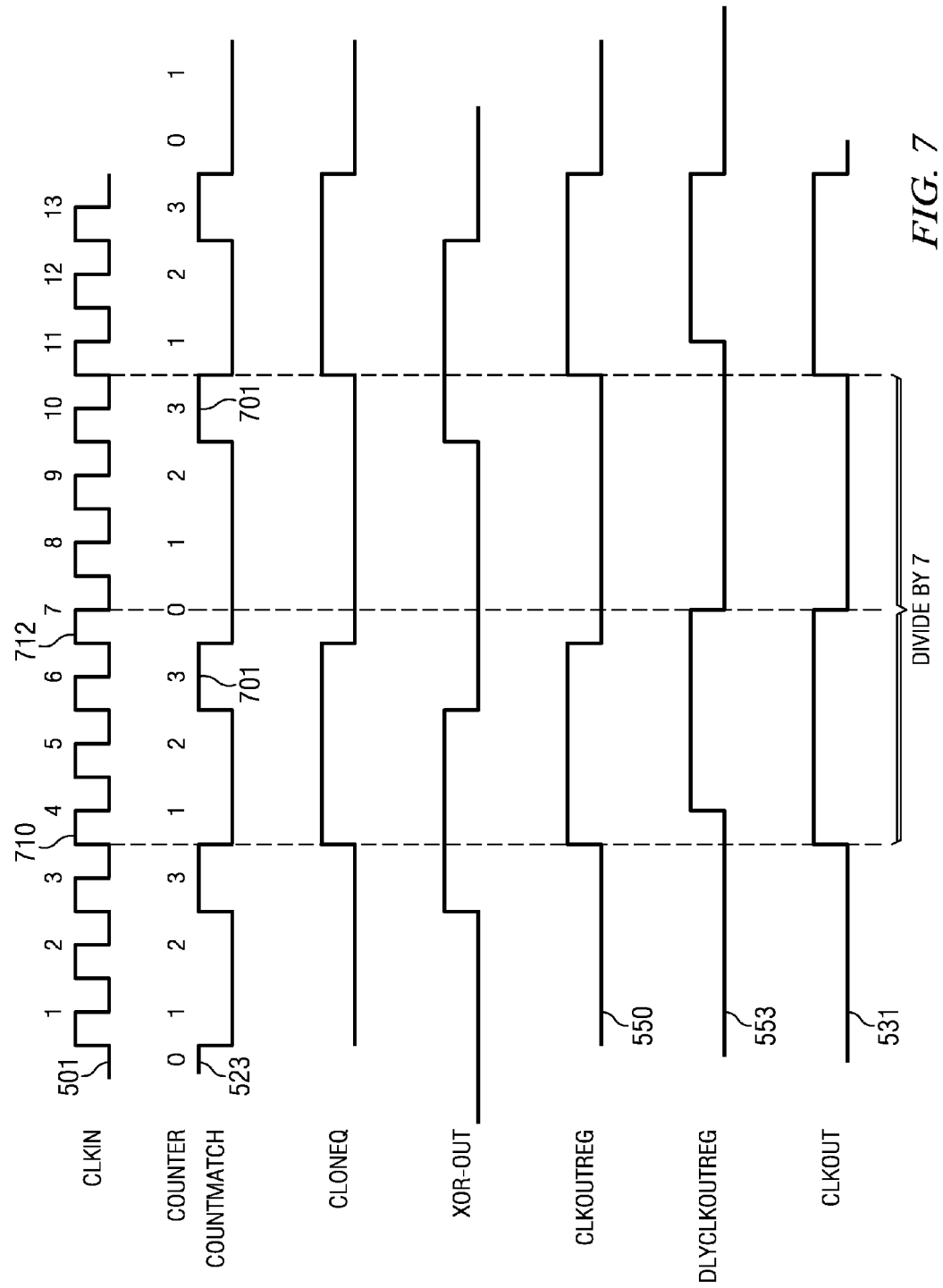
Figure 8:
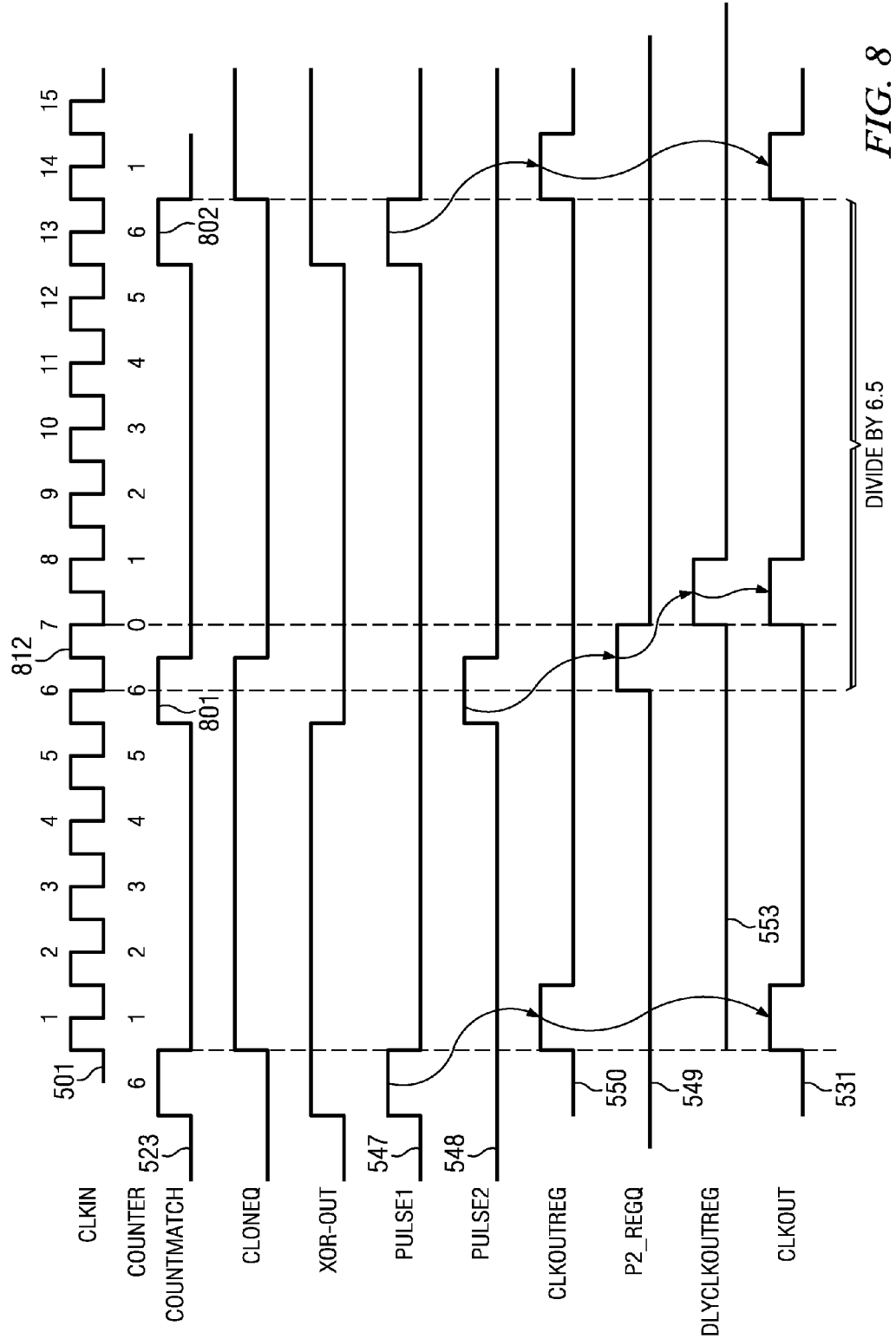

Finite state machine 526 receives count match signal 523, divide factor bit(0) signal 512, fractional indicator enable signal 514 and controls selector 525 in order to provide the correct operation of counter, as will described in more detail with regard to FIGS. 6-8. Additional test mode operations may be performed in response to test mode signals 506. For example, a single clock cycle, or a controlled burst of clock cycles may be performed.

Clock synthesizer module 530 is coupled to receive count indicator 523 and the input clock signal 501. Clock synthesizer module 530 is configured to synthesize one period of an output clock signal 531 in response to each assertion of the count indicator when the fractional indicator is logic 1 indicating an N.5 divide ratio. Clock synthesizer module 530 is also configured to synthesize one period of the output clock signal 531 in response to two assertions of the count indicator when the fractional indicator is logic 0 indicating an integer divide ratio, such that the output clock signal can have a period that is N and N.5 times a period of the input clock signal depending on the fractional indicator value.

Counter 520 and clock synthesizer 530 are designed to have minimal logic between register stages so that input clock 501 can operate at a frequency of 1.0 Ghz or higher. Register 546 is configured to be clocked by the input clock signal and to latch an output from an exclusive OR (XOR) function 544. XOR function 544 is coupled to receive the count indicator 523 and an output signal CLONEQ from the Q output of register 546.

Register 549 is configured to be clocked by input clock signal 502 and is coupled to latch an output from AND function 548. AND function 548 is coupled to receive the count indicator 523 and a negative value of the output from XOR function 544. In this embodiment, input clock 502 is the same as input clock 501, except it is gated off for two cycles after an asynchronous clock divider align signal 505 is asserted. Signal 505 may be used to initialize and align several clock dividers 500 that are operating in parallel.

Register 550 is configured to clock on positive edges of the input clock signal 502. Register 550 is configured to latch the output from XOR function 544 when the divide ratio is N, and to latch an output from AND function 547 when the divide ratio is N.5 in response to selector 545. Selector 545 is controlled by fractional indicator 514. AND function 547 is coupled to receive the count indicator 523 and the output from the XOR function 544.

Register 553 is configured to clock on negative edges of the input clock signal. Register 553 is configured to latch an output from the register 550 when the divide ratio is N and odd in response to AND gate 551 that is controlled by divide factor bit(0) signal 512, and to latch a low logic value when the divide ratio is N and even in response to AND gate 551 when divide factor bit(0) is logic 0. When the fractional indicator signal 514 indicates the divide ratio is N.5, then selector 552 causes register 553 to latch an output from register 549.

OR function 540 is coupled to receive an output from register 550 and an output from register 553. An output from OR function 540 provides output clock signal 531. OR function 540 includes a NAND function 543 coupled to receive an output from inverter 541 coupled to the output register 550 and to receive an output from inverter 542 coupled to the output of register 553, such that a rise time and a fall time of output clock signal 531 are thereby balanced.

In another embodiment, XOR function 544 may be eliminated by clocking register 546 with count indicator signal 523 and configuring register 546 to produce a toggled signal each time count indicator 523 is asserted.

FIGS. 6-8 illustrate clock division by 6, 7 and 6.5 by clock divider 500 of FIG. 5. In FIG. 6, the divide ratio N is six. Therefore, a divide factor value F of three is loaded into divide factor register 510. Divide factor bit(0) is set to zero to indicate the divide ratio N is even. Fractional indicator 513 is set to logical 0 to indicate divide ratio N is an integer. Counter 520 is initialized with 1. After three cycles, count indicator 523 is asserted as indicated at 601. At this point, counter 520 is again reloaded with 1 and after three cycles count indicator 523 is asserted as indicated at 602. Register 550 operates as described above, while register 553 remains low in response to AND gate 551 as described above since N is even. OR function 530 therefore produces output clock signal 531 that is divided by six from input clock 501.

In FIG. 7, the divide ratio N is seven. Therefore, a divide factor value F of three is loaded into divide factor register 510. However, divide factor bit(0) is set to one to indicate the divide ratio N is odd. Fractional indicator 513 is set to logical 0 to indicate divide ratio N is an integer. Counter 520 is initialized with 1. After three cycles, count indicator 523 is asserted as indicated at 701. At this point, counter 520 is reloaded with 0 in response to N being odd and after four cycles count indicator 523 is asserted as indicated at 702. Register 550 operates as described above, while register 553 toggles as described above on a negative edge 712 of input clock 501 since N is odd in response to AND gate 551. OR function 530 therefore produces output clock signal 531 that is divided by seven from input clock 501.

In FIG. 8, the divide ratio N is 6.5. Therefore, a divide factor value F of (6.5*2)/2=6 is loaded into divide factor register 510. Divide factor bit(0) is set to one to indicate the adjusted divide ratio 2(N.5) is odd. Fractional indicator 513 is set to logical 1 to indicate divide ratio is N.5. Counter 520 is initialized with 1. After six cycles, count indicator 523 is asserted as indicated at 801. At this point, counter 520 is reloaded with 0 in response to adjusted divide ratio 2(N.5) being odd. After seven cycles, count indicator 523 is asserted as indicated at 802. The output of AND function 547 is fed to register 550 as described above, while register 548 is fed to register 553 as described above on a negative edge 812 of input clock 501 since the fractional indicator is asserted. OR function 530 therefore produces output clock signal 531 that is divided by 6.5 from input clock 501.

Figure 9:
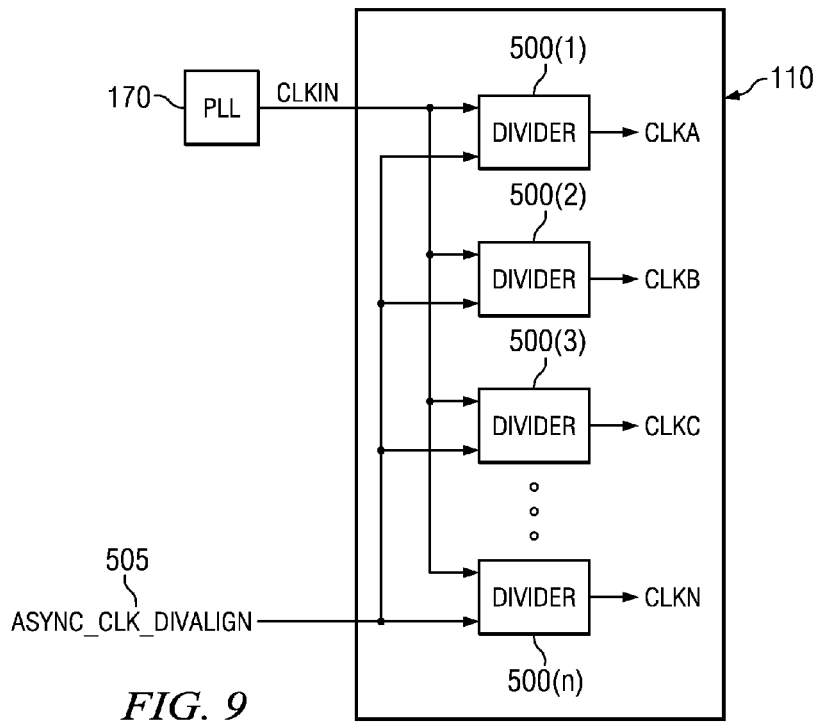
FIG. 9 illustrates multiple clock dividers that may be included within each core module of FIG. 2.

FIG. 9 illustrates multiple clock dividers 500(1)-500(n) that may be included within each core module 110 of FIG. 2. Each clock divider 500(n) may be similar to the clock divider 500 described in FIG. 5. All of these clock dividers are driven by a clock signal CLK_IN that is generated by a phase locked loop 170, referring back to FIG. 1. In this example, it will be assumed that CLK_IN is a 1.0 GHz clock signal. Each clock divider 500(n) may be loaded with a divide factor to produce a divided clock signal for a portion of core module 110. For example, CPU 112 may operate on an undivided 1.0 GHz clock signal CLKA from divider 500(1), while RAM/Cache 266 may operate on a divided by two clock signal CLKB from divider 500(2), the power down logic operates on a divided by three clock signal CLKC from divider 500(3), etc.

As mentioned earlier, it may be a requirement for the clock signals from several different clock dividers to be aligned. This may be accomplished by resetting all of the dividers with the async_clk_divalign signal 505, as described with regard to FIG. 5. This causes all of the dividers to initially start operating in alignment. Thereafter, the clock signals will become aligned periodically depending on the divide factors. For example, if the divide factors are one, two, and three, as discussed above, all three clock signals will be aligned on every sixth clock pulse of the input clock CLK_IN.

Figure 10:
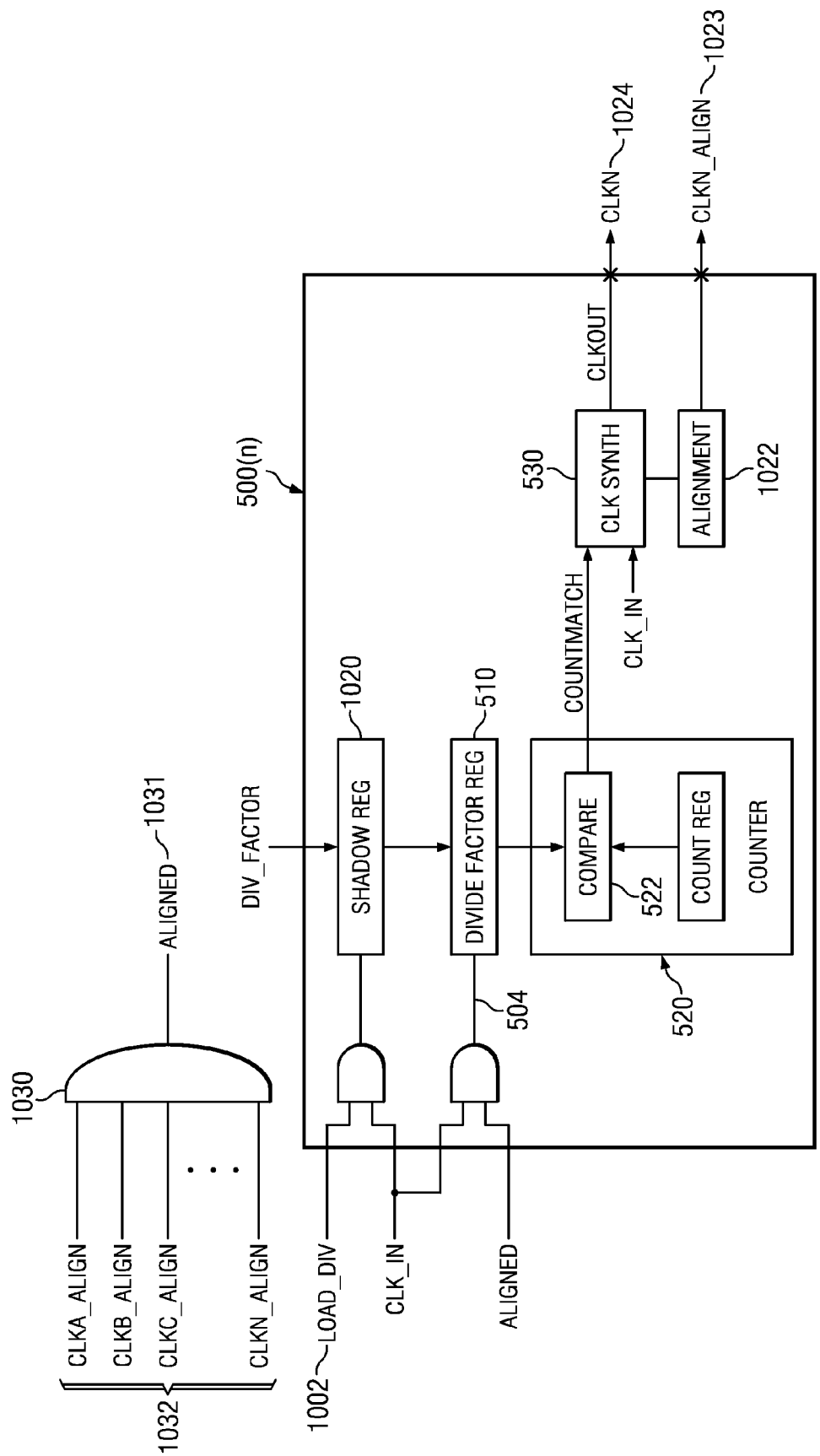
FIG. 10 is a block diagram of an exemplary clock divider illustrating a mechanism to allow changing of a clock divider factor on the fly.

FIG. 10 is a block diagram of an exemplary clock divider illustrating a mechanism to allow changing of a clock divider factor on the fly. While core 110 is operating, it may by useful to change one or more of the clock divide factors. For example, a program may determine that the current task does not require high performance and may request the clock be slowed down. A later task may require full performance and request the clock be speeded up. In this manner, an application program being executed on core 110 may reduce power consumption during periods of time that do not require maximum performance.

In order to maintain clock alignment between several clock dividers, the divide factor may only be changed at a specific point in time; otherwise the dividers may need to be stopped and restarted using the async_clk_divalign signal, as described above. Shadow register 1020 is provided in each clock divider 500(*n*) that may be loaded with a new clock divide factor at any time when enabled by the LOAD_DIV signal 1002. Each shadow register may be a memory mapped register and the LOAD_DIV may be asserted in response to decoding the address of shadow register 1020 during a memory write transaction, for example. In another embodiment, LOAD_DIV may be asserted in response to command from a configuration register, for example.

At a particular point in time, an alignment signal 1031 is asserted to cause divide factor register 510 to be loaded at a required point in time to maintain clock alignment among the several clock dividers that need to be maintained in alignment. Alignment signal 1031 is generated by an "AND" function 1030 that monitors alignment pulses 1032 generated by each of the several clock dividers. Within clock divider 500 (*n*), alignment logic 1022 monitors the operation of clock synthesizer 530 and generates a pulse on alignment signal 1023 at the start of each clock period of clock signal CLKN 1024 that is output by clock divider 500(*n*).

Figure 11:
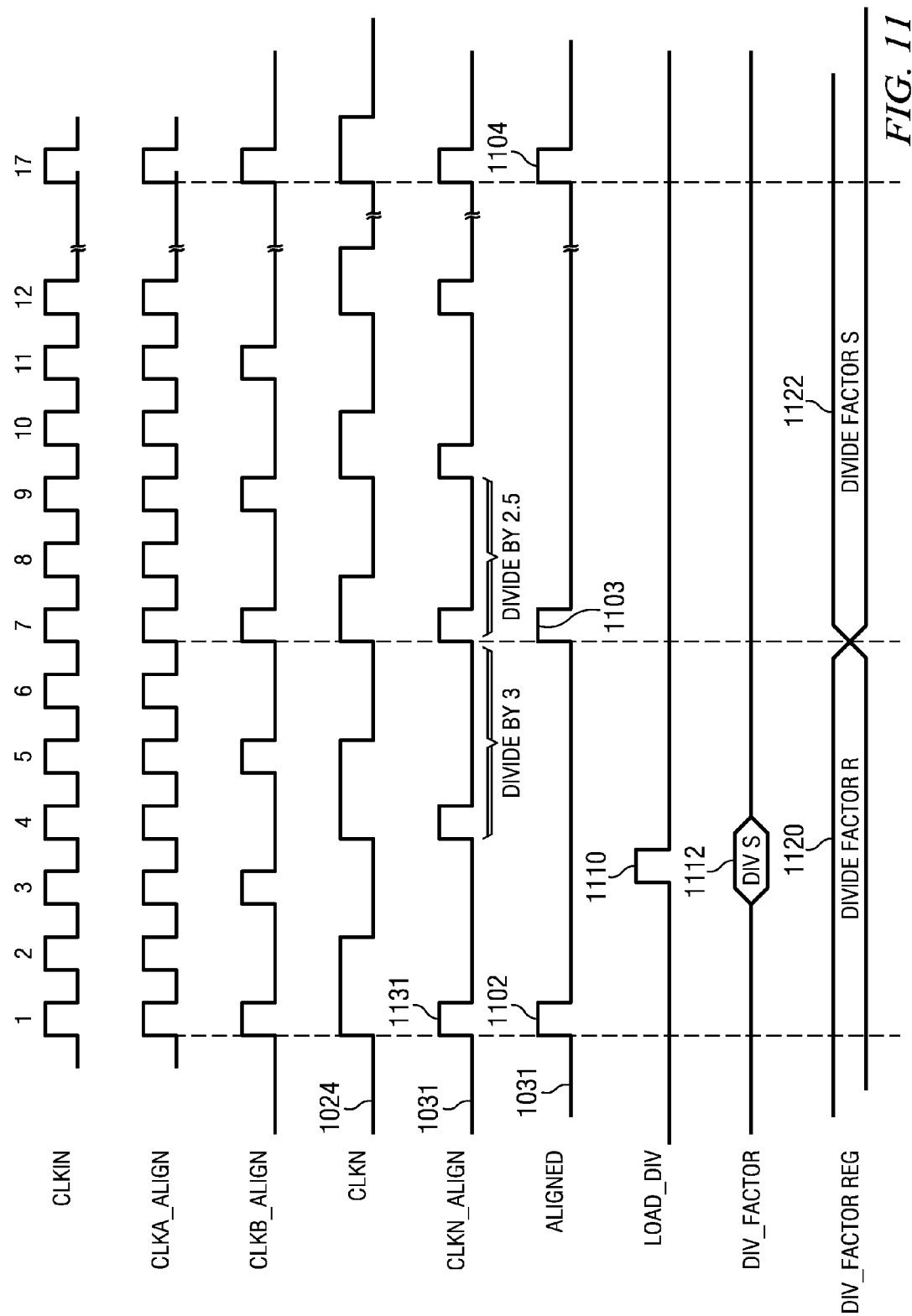
FIG. 11 is a timing diagram illustrating operation of the mechanism of FIG. 10.

FIG. 11 is a timing diagram illustrating operation of the mechanism of FIG. 10. For illustration, three alignment signals are shown: CLKA_ALIGN, CLKB_ALIGN, and CLKN_ALIGN; however, various embodiments may include more or fewer clock dividers in this alignment process. CLKN 1024 is shown to illustrate the relationship between each divided clock signal and the alignment signal generated by the respective clock divider module. CLKN_ALIGN signal 1031 has a pulse, such as alignment pulse 1131 asserted at the beginning of each period of clock signal CLKN 1024, as discussed above.

In this example, CLKA is divided by one, CLKB is divided by two, and CLKN is initially divided by three. Thus, an alignment pulse 1102, 1103 is asserted on alignment signal 1031 every six clock cycles of CLKIN. At some random point in time, a new divide factor 1112 may be presented to divide shadow register 1020 in clock divider 500(*n*) and latched therein in response to enable signal LOAD_DIV, as described above. In this illustration, the divide factor register currently contains a divide factor for divide by three and the new divide factor 1112 specifies a divide by 2.5.

After the new divide factor 1112 for divider 500(*n*) is loaded into shadow register 1030, the next occurrence of an alignment pulse on alignment signal 1031 will trigger the new divide factor to be loaded into divide factor register 502. Thus, alignment pulse 1103 triggers loading the new divide factor into divide factor register 502 and clock divider 500(*n*) immediately begins to generate a divide by 2.5 clock signal CLKN that is in proper alignment with clock signals CLKA and CLKB.

The three clock signals now have periods of one, two and 2.5 times the CLKIN period and will therefore be in alignment every ten cycles of CLKIN, as indicated at 1104.

While this example illustrated changing the divide factor for one clock divider, two or more clock dividers may be changed at the same time by loading a new divide factor in the shadow register of each one. When the next alignment pulse occurs, all of the dividers will be updated at the same time.

Figure 12:
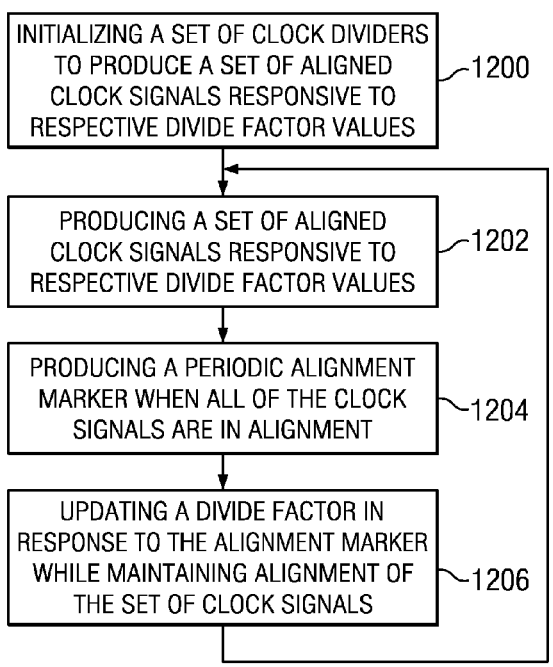
FIG. 12 is a flow diagram illustrating dynamic updating of divider factors while maintaining clock alignment.

FIG. 12 is a flow diagram illustrating dynamic updating of divider factors while maintaining clock alignment. A set of clock signals is produced 1202 from an input clock signal by a plurality of clock dividers responsive to respective divide factor values as described in more detail above. The set of clock signals are initialized 1200 to be in alignment by starting all of the clock dividers in response to an initialization signal, such as the async_clk_divalign signal described above.

A periodic alignment marker is produced 1204 when all of the plurality of clock signals are in alignment. This marker may be a pulse on an alignment signal, such as pulses 1102-1104 on alignment signal 1031, for example.

The divide factor value is updated 1206 in a first one of the clock dividers in response to an occurrence of the alignment marker. As described in more detail above, the updated clock divider continues to generate a clock signal responsive to the updated divide factor value in such a manner that the set of clock signals remains in alignment.

A new divide factor may be stored in a shadow register of the first clock divider without regard to the alignment marker prior to updating 1206 the divide factor in the first clock divider, as illustrated at 1110, 1112 in FIG. 11.

More than one divide factor may be updated 1206 on the same alignment marker. Referring back to FIG. 11, several divide factors may be stored in shadow registers in several different clock dividers during the time period between alignment marker 1102 and alignment marker 1103, for example. Then, when alignment marker 1103 occurs, all of the new divide factors will update the respective clock dividers.

Figure 13:
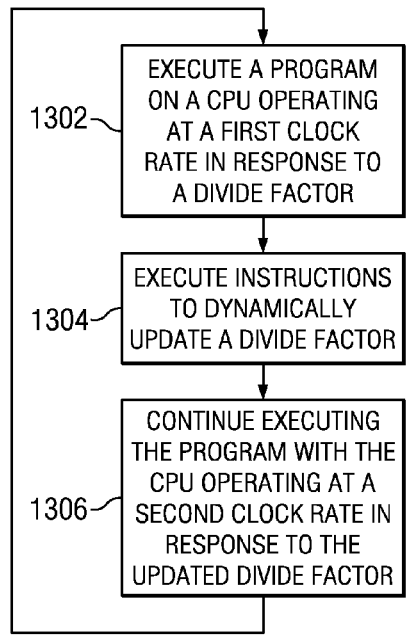
FIG. 13 is a flow diagram illustrating dynamic clock divide factor updating.

FIG. 13 is a flow diagram illustrating dynamic clock divide factor updating. In this example, a program is being executed 1302 on a CPU that is operated at a first clock frequency in response to a clock signal that is generated by a clock divider in response to a first divide factor.

During execution of the program, a decision may be made to change the clock speed of the processor. This may be done to speed up the processor to increase performance, or to slow down the processor when performance is not needed in order to conserve power, for example. Under control of the program, instructions may be executed that direct uploading 1304 of a second divide factor, such that the CPU continues to execute 1306 the program in response to the clock signal generated by the second divide factor.

System Example

Figure 14:
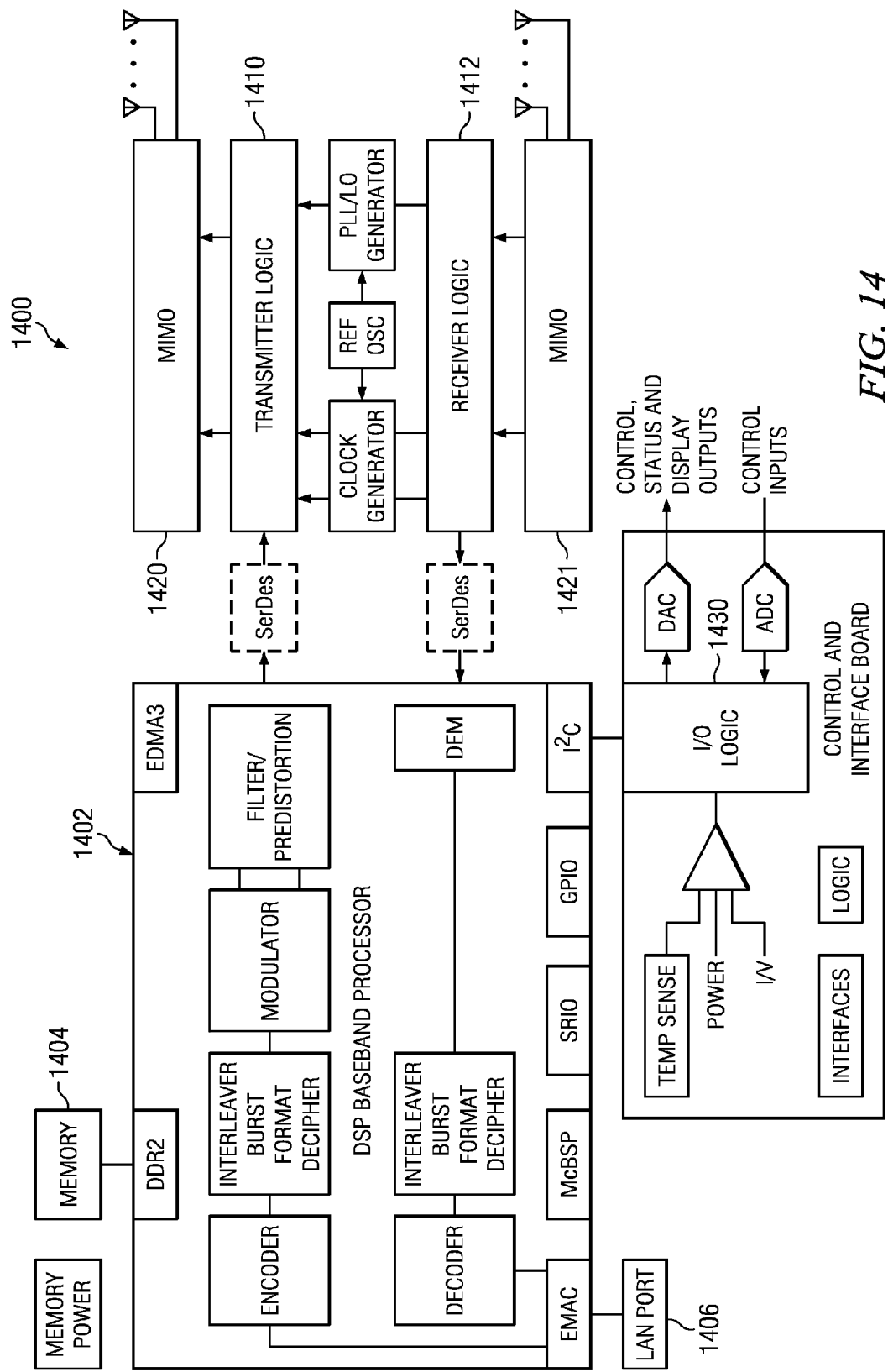
FIG. 14 is a block diagram of a system that includes the SoC of FIG. 1.

FIG. 14 is a block diagram of a base station for use in a radio network, such as a cell phone network. SoC 1402 is similar to the SoC of FIG. 1 and is coupled to external memory 1404 that may be used, in addition to the internal memory within SoC 1402, to store application programs and data being processed by SoC 1402. Transmitter logic 1410 performs digital to analog conversion of digital data streams transferred by the external DMA (EDMA3) controller and then performs modulation of a carrier signal from a phase locked loop generator (PLL). The modulated carrier is then coupled to multiple output antenna array 1420. Receiver logic 1412 receives radio signals from multiple input antenna array 1421, amplifies them in a low noise amplifier and then converts them to digital a stream of data that is transferred to SoC 1402 under control of external DMA EDMA3. There may be multiple copies of transmitter logic 1410 and receiver logic 1412 to support multiple antennas.

The Ethernet media access controller (EMAC) module in SoC 1402 is coupled to a local area network port 1406 which supplies data for transmission and transports received data to other systems that may be coupled to the internet.

An application program executed on one or more of the processor modules within SoC 1402 encodes data received from the internet, interleaves it, modulates it and then filters and pre-distorts it to match the characteristics of the transmitter logic 1410. Another application program executed on one or more of the processor modules within SoC 1402 demodulates the digitized radio signal received from receiver logic 1412, deciphers burst formats, and decodes the resulting digital data stream and then directs the recovered digital data stream to the internet via the EMAC internet interface. The details of digital transmission and reception are well known.

A program task module being executed on a CPU in SoC 1402 may dynamically change the divide factors in the clock dividers that generate the clock signals for the core modules of SoC 14. During periods of transmission or reception, the task module may detect that maximum performance is needed and then direct all of the clock dividers to be updated with divide factors for maximum system performance. During periods of reception only, the task module may detect that transmission is not needed and then direct the clock dividers in a core that performs transmission encoding to be updated with divide factors for reduced performance in order to reduce power consumption. During periods of limited or no reception only, the task module may detect that processing performance may be further reduced and then direct the clock dividers in various cores to be updated with divide factors for reduced performance in order to further reduce power consumption.

Input/output logic 1430 may be coupled to SoC 1402 via the inter-integrated circuit (I2C) interface to provide control, status, and display outputs to a user interface and to receive control inputs from the user interface. The user interface may include a human readable media such as a display screen, indicator lights, etc. It may include input devices such as a keyboard, pointing device, etc.

Other Embodiments

Although the invention finds particular application to Digital Signal Processors (DSPs), implemented, for example, in a System on a Chip (SoC), it also finds application to other forms of processors. A SoC may contain one or more megacells or modules which each include custom designed functional circuits combined with pre-designed functional circuits provided by a design library.

While the invention has been described with reference to illustrative embodiments, this description is not intended to be construed in a limiting sense. Various other embodiments of the invention will be apparent to persons skilled in the art upon reference to this description. For example, in another embodiment, a different modules and components may be included in an SoC that require different sets of clock signals.

In another embodiment, a clock generation circuit as described herein may be implemented on an integrated circuit that is much simpler than the SoCs described herein. A simple integrated circuit may still benefit from a clock circuit that provides a high-speed clock divider that is capable of integer and half step increment, and that guarantees alignment of the output clocks.

In another embodiment, dynamic changing of the divide ratios may be performed under control of a test bed that is being used to test an integrated circuit that contains one or more clock dividers as described herein. Dynamic changing of clock divide ratios during testing allows testing to proceed without stopping the clock to perform alignment.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A system comprising a clock divider, wherein the clock divider comprises:
    a divide factor register configured to store a divide factor value F representative of a divide ratio N;
    a fractional indicator register configured to store a fractional indicator value, wherein the fractional indicator indicates the divide ratio is N.5 when the fractional indicator is a first value and indicates the divide ratio is N when the fractional indicator is a second value;
    a counter coupled to the divide factor register, wherein the counter is operable to receive an input clock signal having a clock cycle frequency and to repeatedly count N/2 input clock cycles and assert a count indicator when N is even, and to alternately count N/2 input clock cycles and assert the count indicator and then count 1+N/2 input clock cycles and assert the count indicator when N is odd; and
    a clock synthesizer module coupled to receive the count indicator and the input clock signal, wherein the clock synthesizer module is configured to synthesize one period of an output clock signal in response to each assertion of the count indicator when the fractional indicator is the first value, and wherein the clock synthesizer module is configured to synthesize one period of the output clock signal in response to two assertions of the count indicator when the fractional indicator is the second value, such that the output clock signal can have a period that is N and N.5 times a period of the input clock signal depending on the fractional indicator value.

2. The clock divider of claim 1, wherein F=2(N.5)/2 when the fractional indicator is the first value and F=N/2 when the fractional indicator is the second value.

3. The clock divider of claim 1, wherein the clock synthesizer comprises:
    a first register configured to be clocked by the input clock signal and coupled to latch an output from an exclusive OR (XOR) function, wherein the XOR function is coupled to receive the count indicator and an output from the first register;

a second register configured to be clocked by the input clock signal and coupled to latch an output from a second AND function, wherein the second AND function is coupled to receive the count indicator and a negative value of the output from the XOR function;

a third register configured to clock on positive edges of the input clock signal, wherein the third register is configured to latch the output from the XOR function when the divide ratio is N, and to latch an output from a first AND function when the divide ratio is N.5, wherein the first AND function is coupled to receive the count indicator and the output from the XOR function;

a fourth register configured to clock on negative edges of the input clock signal, wherein the fourth register is configured to latch an output from the third register when the divide ratio is N and odd, to latch a low logic value when the divide ratio is N and even, and to latch an output from the second register when the divide ratio is N.5; and an OR function coupled to receive an output from the third register and an output from the fourth register, wherein an output from the OR function provides the output clock signal.

4. The clock divider of claim 3, wherein the OR function comprises a NAND function coupled to receive an output from a first inverter coupled to the output of the third register and to receive an output from a second inverter coupled to the output of the fourth register, such that a rise time and a fall time of the output clock signal are thereby balanced.

5. The clock divider of claim 1, wherein the synthesizer comprises:

a circuit configured to form a toggle signal that toggles in response to each assertion of the count indicator;

a first register configured to be clocked by the input clock signal and coupled to latch an output from a second AND function, wherein the second AND function is coupled to receive the count indicator and a negative value of the toggle signal;

a second register configured to clock on positive edges of the input clock signal, wherein the second register is configured to latch the toggle signal when the divide factor value is N, and to latch an output from a first AND function when the divide ratio is N.5, wherein the first AND function is coupled to receive the count indicator and the toggle signal;

a third register configured to clock on negative edges of the input clock signal, wherein the third register is configured to latch an output from the second register when the divide ratio is N and odd, to latch a low logic value when the divide ratio is N and even, and to latch an output from the first register when the divide ratio is N.5; and an OR function coupled to receive an output from the second register and an output from the third register, wherein an output from the OR function provides the output clock signal.

6. The clock divider of claim 1, further comprising:

a shadow register with outputs coupled to the divide factor register and to the fractional indicator; wherein the shadow register is configured to receive and store the divide factor value and fractional indicator value; and control logic configured to receive an alignment signal and to enable the divide factor register and the fractional indicator to receive the stored divide factor value and fractional indicator value from the shadow register when the alignment signal is asserted.

7. The system of claim 6, being formed within a single integrated circuit, further comprising:

a plurality of the clock dividers coupled to receive the input clock signal; and alignment logic coupled to the output clock signals of the plurality of clock dividers, the alignment logic operable to detect when all of the output clock signals of the plurality of clock dividers are in alignment and to then assert the alignment signal.

8. The system of claim 1, wherein the clock cycle frequency of the input clock signal is one gigahertz or more.

9. The system of claim 1 being formed within a single integrated circuit, further comprising:

a plurality of core modules interconnected by a switch fabric;

a clock generation circuit configured to produce the input clock signal, wherein the input clock signal is coupled to each of the plurality of core modules; and wherein each core module comprises one of the clock dividers.

10. A method for dividing an input clock signal to produce an output clock signal, the method comprising:

receiving a divide factor value F representative of a divide ratio N, wherein the N may be an odd or an even integer;

receiving a fractional indicator, wherein the fractional indicator indicates the divide ratio is N.5 when the fractional indicator is a first value and indicates the divide ratio is N when the fractional indicator is a second value, wherein F=2(N.5)/2 when the fractional indicator is the first value and F=N/2 when the fractional indicator is the second value;

receiving the input clock signal having a clock cycle frequency;

periodically asserting a count indicator every N/2 input clock cycles when N is even; periodically asserting the count indicator alternately N/2 input clock cycles and then 1+N/2 input clock cycles when N is odd;

synthesizing one period of an output clock signal in response to each assertion of the count indicator when the fractional indicator is the first value indicating the divide ratio is fractional N.5; and synthesizing one period of the output clock signal in response to two assertions of the count indicator when the fractional indicator is the second value the divide ratio is an integer N, such that the output clock signal can have a period that is N and N.5 times a period of the input clock signal depending on the fractional indicator value.

11. The method of claim 10, wherein when the fractional indicator has the first value, every other period of the output clock is aligned using a rising edge of the input clock at the start of the period and aligned using a falling edge of the input clock at the end of the period.

12. The method of claim 11, wherein when the fractional indicator has the second value and N is odd, the rising edge of the input clock is used to align a first half period of the output clock and the falling edge of the input clock is used to align a second half period of the output clock.

13. The method of claim 10, wherein the clock cycle frequency of the input clock signal is one gigahertz or more.

* * * * *